(12) United States Patent
Kim et al.

(10) Patent No.: US 7,998,846 B2
(45) Date of Patent: Aug. 16, 2011

(54) 3-D INTEGRATED CIRCUIT SYSTEM AND METHOD

(75) Inventors: Eunha Kim, Menlo Park, CA (US); Jeremy Wahl, Sunnyvale, CA (US); Shenqing Fang, Fremont, CA (US); YouSeok Suh, Cupertino, CA (US); Kuo-Tung Chang, Saratoga, CA (US); Yi Ma, Santa Clara, CA (US); Rinji Sugino, San Jose, CA (US); Jean Yang, Glendale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/209,478

(22) Filed: Sep. 12, 2008

(65) Prior Publication Data

US 2010/0065940 A1  Mar. 18, 2010

(51) Int. Cl.
  *H01L 21/263* (2006.01)
(52) U.S. Cl. ........ 438/487; 438/486; 438/489; 438/799; 438/478; 257/E21.028; 257/E21.134; 257/E21.347
(58) Field of Classification Search .................. 438/166, 438/486, 487, 489, 799, 478; 257/E21.028, 257/E21.134, E21.347
  See application file for complete search history.

(56) References Cited

U.S. PATENT DOCUMENTS

| | | | | |
|---|---|---|---|---|
| 6,787,825 B1 * | 9/2004 | Gudesen et al. | ............... | 257/278 |
| 2001/0002324 A1 * | 5/2001 | Maekawa et al. | ............. | 438/157 |
| 2002/0068421 A1 * | 6/2002 | Yamazaki et al. | ............ | 438/486 |
| 2006/0063351 A1 * | 3/2006 | Jain | ............... | 438/455 |
| 2007/0141858 A1 * | 6/2007 | Gu | ............... | 438/795 |

* cited by examiner

*Primary Examiner* — Ngan Ngo
*Assistant Examiner* — Benjamin Tzu-Hung Liu

(57) ABSTRACT

A semiconductor fabrication system and method are presented. A three dimensional multilayer integrated circuit fabrication method can include forming a first device layer and forming a second device layer on top of the first device layer with minimal detrimental heat transfer to the first layer by utilizing a controlled laser layer formation annealing process. A controlled laser crystallization process can be utilized and the controlled laser can include creating an amorphous layer; defining a crystallization area in the amorphous layer, where in the crystallization area is defined to promote single crystal growth (i.e. prevent multi-crystalline growth); and applying laser to the crystallization area, wherein the laser is applied in a manner that prevents undesired heat transfer to another layer.

12 Claims, 6 Drawing Sheets

100

110

Forming a first device layer.

120

Forming a second device layer on top of the first device layer without detrimental heat transfer to the first layer by utilizing a controlled laser layer formation annealing process.

Creating an amorphous layer.

220

Defining a recrystalization area in the amorphous layer, where in the recrystallization are is defined to prevent undesired heat transfer to another layer.

230

Applying laser to said recrystalization area, wherein said laser is applied in a manner that prevents undesired heat transfer to another layer.

FIG 2

3-D INTEGRATED CIRCUIT SYSTEM AND METHOD

FIELD OF THE INVENTION

The present invention relates to the field of integrated circuit design and semiconductor chip fabrication. More particularly, the present invention relates to an efficient and effective system and method for fabricating three dimensional integrated circuits with multiple device layers.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include integrated circuits. Integrated circuit fabrication usually involves multi-step processes that attempt to produce precise components. Many integrated circuit component fabrication processes involve complicated interactions that can have detrimental impacts on other components within the integrated circuit. It can be very difficult to achieve optimized results within requisite tolerances.

Semiconductor integrated circuit manufacturing efforts are usually complicated by ever increasing demands for greater functionality. More complicated circuits are usually required to satisfy the demand for greater functionality. For example, there is usually a proportional relationship between the number of components included in an integrated circuit and the functionality, integrated circuits with more components typically provide greater functionality. However, including more components within an integrated circuit often requires the components to be densely packed in relatively small areas and reliably packing a lot of components in relatively small areas of an IC is usually very difficult. For example, as devices scale down to a 32 nm node or less, manufacturing becomes increasingly challenging due to fundamental limits such as defining such small structures.

Some traditional approaches have attempted to achieve greater densities by utilizing three dimensional integrated circuits with multiple layers of devices. However, achieving high quality single crystal silicon for the upper layer devices has been a major roadblocks in the pursuit of three-dimensional multilayer device fabrication. Many integrated circuit devices rely upon very precise building blocks (e.g., a single crystal silicon region) for fabrication of reliable and proper operating devices. Conventional attempts at utilizing heat for annealing and creating single crystal regions is a second layer device region are difficult to implement because heat transfers to other layers are problematic. Attempts at fabricating the layers as separate dies and then combining them have also proved problematic due to lack of cost effective precise alignment techniques when mating the two separately fabricated portions.

SUMMARY OF THE INVENTION

A semiconductor fabrication system and method are presented. In one embodiment of the present invention, a three dimensional multilayer integrated circuit fabrication method includes forming a first device layer and forming a second device layer on top of the first device layer with minimal detrimental heat transfer to the first layer by utilizing a controlled laser layer formation annealing process. In one embodiment a controlled laser crystallization process is utilized. In one exemplary implementation the controlled laser includes creating an amorphous layer; defining a crystallization area in the amorphous layer, where in the crystallization area is defined to prevent undesired heat transfer to another layer; and applying laser to the crystallization area, wherein the laser is applied in a manner that prevents undesired heat transfer to another layer.

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 1 is a flow chart of an exemplary three dimensional multilayer integrated circuit fabrication method with multiple layers of devices in accordance with one embodiment of the present invention.

FIG. 2 is a flow chart of an exemplary controlled laser crystallization process in accordance with one embodiment of the present invention.

DETAILED DESCRIPTION OF THE INVENTION

Figure 3A:
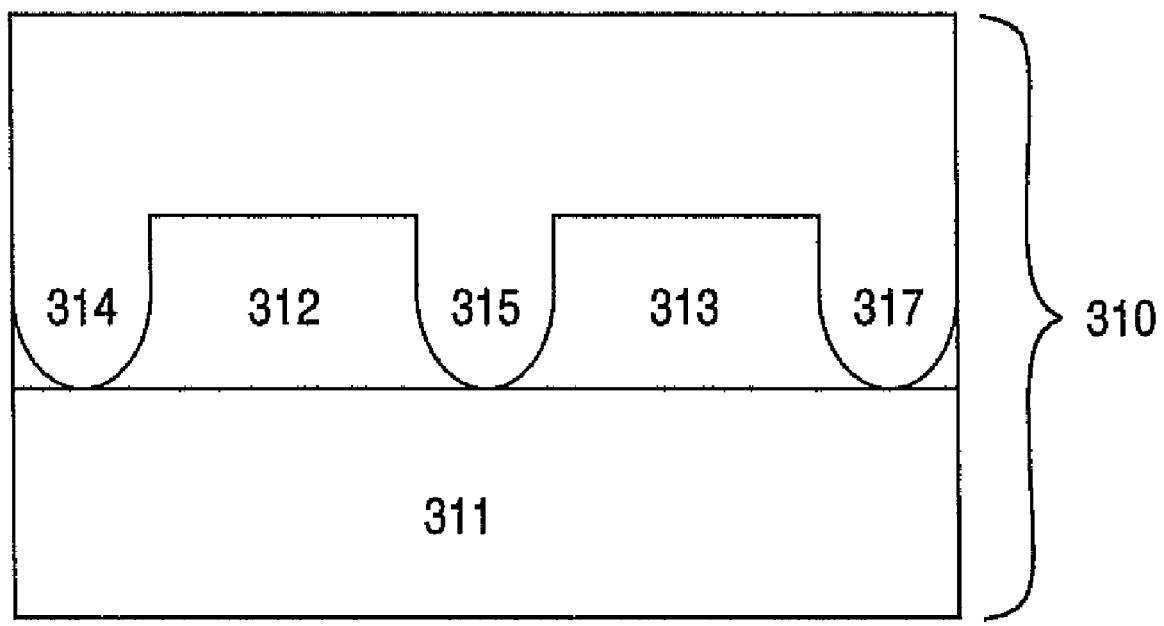
FIG. 3A is a block diagram of an exemplary first device layer in accordance with one embodiment of the present invention prior to creation of a second device layer.

Reference will now be made in detail to the preferred embodiments of the invention, a semiconductor isolation material deposition system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Convenient and efficient three dimensional multilayer integrated circuit systems and methods with multiple layers of devices are presented. A three dimensional multilayer integrated circuit system and method can facilitate implementation of numerous devices in a single package with a densely packed configuration. In one embodiment, a controlled laser crystallization process is utilized to form single crystal silicon for upper layers of a three dimensional integrated circuit with multiple layers of devices. The application of lasers to controlled areas minimizes excess heat transfer to undesired regions.

FIG. 1 is a flow chart of three dimensional multilayer integrated circuit fabrication method 100 with multiple layers of devices in accordance with one embodiment of the present invention. In one embodiment, three dimensional multiplayer integrated circuit fabrication method 100 facilitates fabrication of a plurality of device layers on top of one another.

In block 110, a first device layer is formed. In one embodiment, device formation includes preparation of a silicon wafer, deposition of isolation regions, etching predetermined patterns, and implantation of active regions. It is appreciated the first device layer can include metal layers and interlayer dielectric layer. In one exemplary implementation, lithographic and etching techniques are utilized to in the formation of the first device layer.

In block 120 a second device layer is formed on top of the first device layer without detrimental heat transfer to the first layer by utilizing a controlled laser crystallization process. In one embodiment, the controlled laser crystallization process creates a single crystal region in the second device layer. In one exemplary implementation, the controlled laser crystallization process applies heat in a defined area of the second layer without detrimental effects on the first layer. For example, the laser can be focused on a crystallization area the size of a device, an array of devices, a predetermined size (e.g., 10 square micrometers, 200 square nanometers, etc.).

FIG. 2 is a flow chart of controlled laser crystallization process 200 in accordance with one embodiment of the present invention. In one embodiment, controller laser crystallization process 200 facilitates crystallization of a single crystal silicon area. It is appreciated that controlled laser crystallization processes can also be utilized in recrystallization.

In block 210, an amorphous layer is created. In one embodiment, the amorphous layer includes an amorphous silicon region. In one exemplary implementation, the amorphous layer is included in an upper device layer. It is appreciated an amorphous layer can be created in a lower device layer also. Seed growth from silicon in another layer can be utilized in the creation of the amorphous layer.

At block 220, a crystallization area is defined in the amorphous layer. The crystallization area is defined to promote single crystal growth (e.g., to prevent multi-crystalline growth). In one embodiment, the crystallization area corresponds to a patterned active area and is formed before application of a laser. In one exemplary implementation, the crystallization area corresponds to a device area. The device can be a transistor. In one embodiment, the crystallization area can be up to 10 square micrometers In block 230, a laser is applied to the crystallization area. The laser is applied in a manner that prevents undesired heat transfer to another layer. It is also appreciated the present invention can be implemented with a variety of different lasers. In one embodiment, the laser can vary between a micrometer to a millimeter. In one exemplary implementation, pattern laser crystallization is utilized.

It is appreciated that a number of techniques can be utilized to further enhance control of the laser application and corresponding heat transfer. In one embodiment, a coat layer is applied before application of the laser. The coat layer can be removed after the application of the laser.

FIG. 3A is a block diagram of an exemplary first device layer 310 prior to creation of a second device layer. First device layer 310 includes a substrate 311, active device areas 312 and 313, isolation trenches 314, 315, and 316, and interlayer dielectric layer 317. The active device areas 312 and 313 and isolation trenches 314, 315 and 316 can be formed utilizing lithographic, etching, implantation and deposition techniques.

Figure 3B:
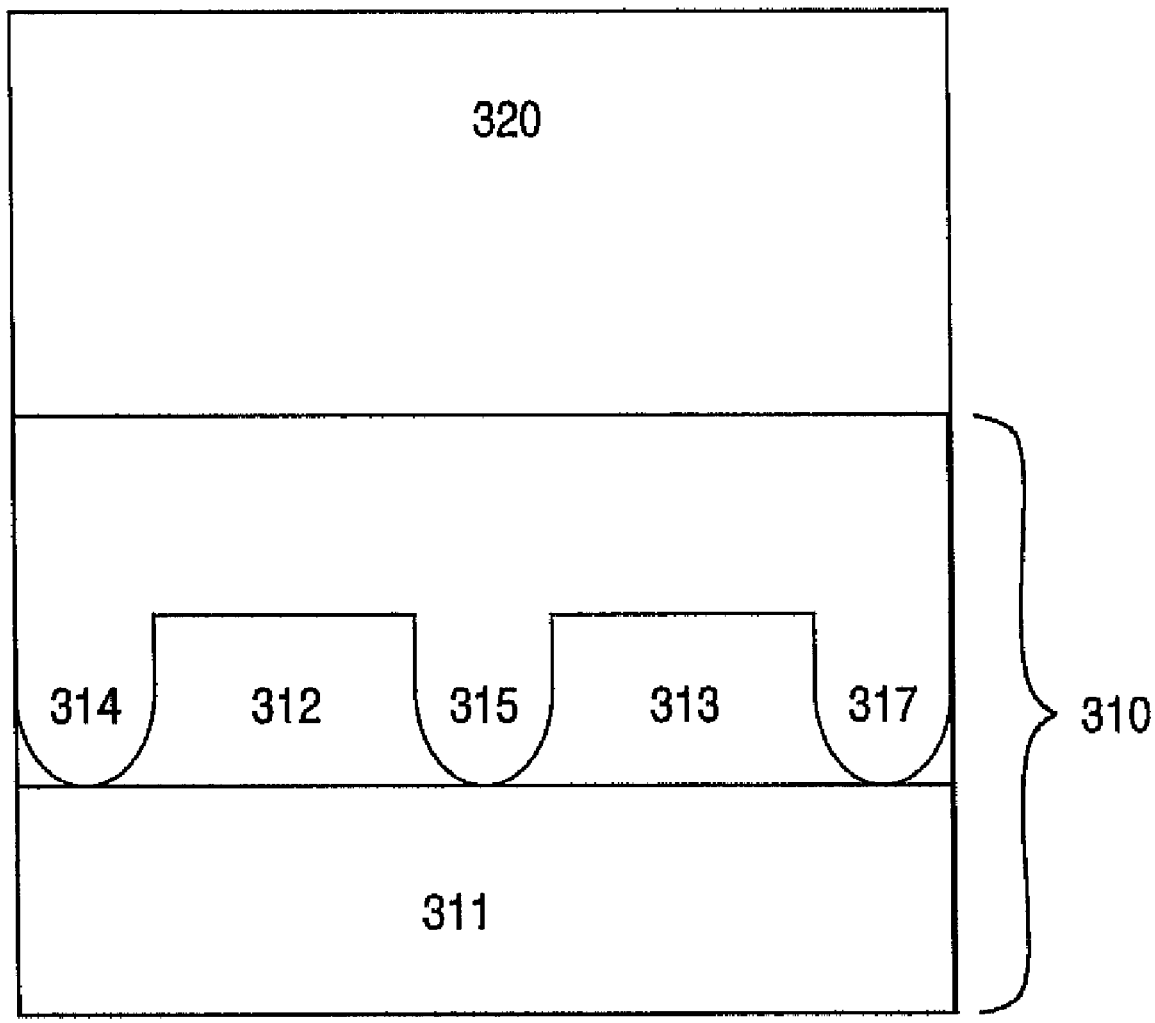
FIG. 3B is a block diagram of an exemplary first device layer with a second amorphous layer in accordance with one embodiment of the present invention.

FIG. 3B is a block diagram of exemplary first device layer 310 with a second amorphous layer 320. Second amorphous layer 320 is formed on top of first device layer 3 10. In one embodiment, second amorphous layer 320 is grown utilizing a seed technique from silicon of first device layer 310.

Figure 3C:
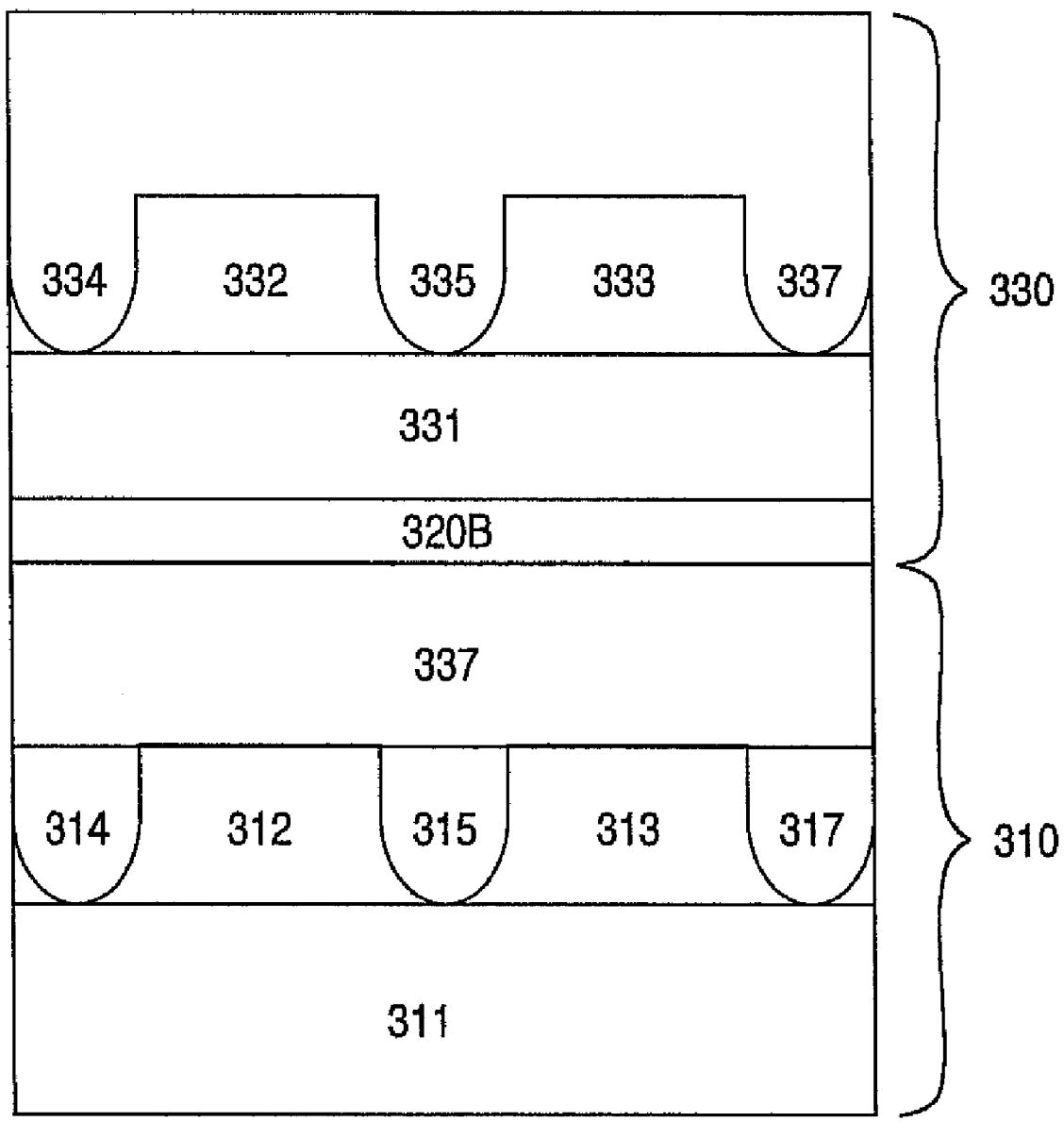
FIG. 3C is a block diagram of an exemplary first device layer and second device layer in accordance with one embodiment of the present invention.

FIG. 3C is a block diagram of an exemplary first device layer 310 and second device layer 330. In one embodiment, second device layer 330 is partially created in amorphous layer 320. Second device layer 330 includes a single crystal area 331, active device areas 332 and 333, isolation trenches 334, 335, and 336, and interlayer dielectric layer 337. The active device areas 332 and 333 and isolation trenches 334, 334 and 336 can be formed utilizing techniques that are somewhat resistant to detrimental impact from heat transfer. In one embodiment, there can be an amorphous 320B region that remains after crystallization.

It is appreciated that a variety of low temperature techniques can be utilized to correspond to a minimal thermal budget difference between the top and bottom layers. In one embodiment, the bottom layer has extra thermal cycles for the top layer. In one embodiment SPA (Slotted Plasma Antenna), LPRO (Low Pressure radical Oxidation), ISSG (In-situ steam generation) or ALD (Atomic Layer deposition) can be utilized in the formation of bottom oxide and top oxide. In one exemplary implementation the SPA can be in the range of 400 C to 600 C, the LPRO in the range of 650 C to 750 C, the ISSG in the range of 750 C to 800 C and the oxide in the range of 600 C-700 C. In one embodiment SPA, ISSG, RTO or ALD can be utilized for IOX. In one exemplary implementation the SPA is in the range of 250 C to 400 C, the LPRO is in the range of 650 C to 650 C and the H2O+H2 (RTO, rapid thermal oxidation) can be in the range of 650 C to 850 C. It is also appreciated that for SD activation low temp RTA plus laser anneal can be utilized. In one embodiment the laser is utilized for activation.

It is also appreciated that additional techniques can be utilized to further facilitate reduction of detrimental impacts associated with heat transfer. In one embodiment, the techniques can include devices formed with polysilicide gates and metal layers and metal connections between devices formed with material resistant to heat transfer affects (e.g., tungsten, copper, etc.).

Figure 4:
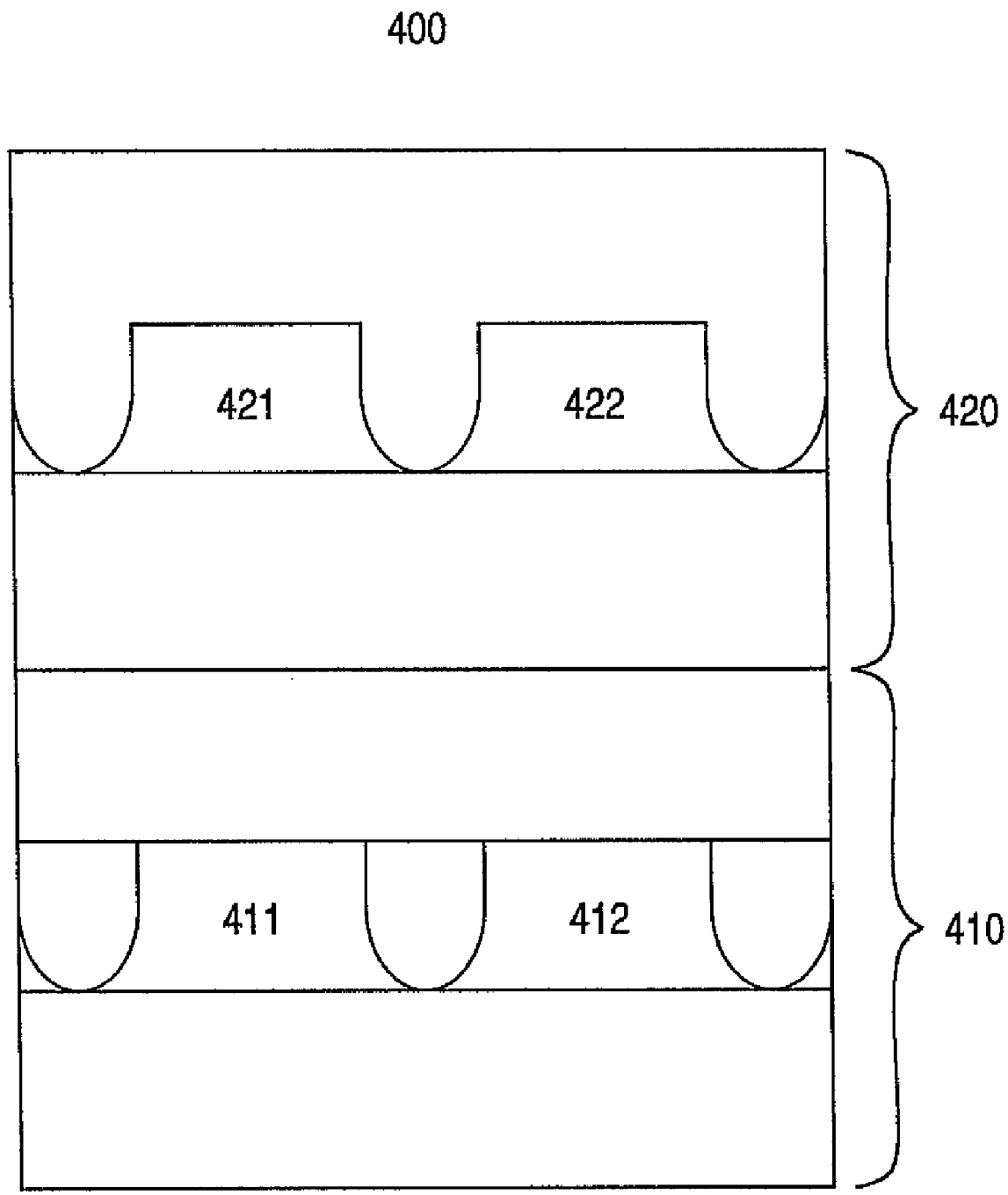
FIG. 4 is a block diagram of an exemplary three dimensional multilayer integrated circuit with multiple layers of devices in accordance with one embodiment of the present invention.

FIG. 4 is a block diagram of an exemplary three dimensional multilayer integrated circuit 400 with multiple layers of devices in accordance with one embodiment of the present invention. The dimensional multilayer integrated circuit 400 includes a first device layer 410 with single crystal fabrication regions 411 and 412 and a second device layer 420 with single crystal fabrication regions 421 and 422. The first device layer is coupled to the second device layer. In one embodiment, the single crystal fabrication regions of the second device layer are formed from silicon seed of the first device layer. The single crystal fabrication regions of the second layer can be defined by silicon isolation trenches and the single crystal fabrication regions are the size of a transistor.

It is appreciated the present invention is compatible with a variety of configurations. For example, the first layer can include peripheral devices and the second layer comprises core devices. The first layer and the second layer can include similar circuitry arrays. In one embodiment, the first layer is utilized in association with a first application and the second layer is utilized in association with a second application.

Thus, a system and method of the present invention facilitates fabrication and utilization of a three dimensional integrated circuit with multiple device layers. The three dimensional integrated circuit can accommodate densely packed devices. In one embodiment, the multiple device layers can be formed with minimal detrimental impacts associated with undesired heat transfer.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A controlled laser crystallization process comprising:
   creating a single crystal fabrication region of a second device layer formed from silicon seed of a first device layer;
   defining a crystallization area in said single crystal fabrication region, wherein said crystallization area is defined to prevent undesired heat transfer to another layer at a different level; and
   applying laser to said crystallization area included in said single crystal fabrication region, wherein said laser is applied in a manner that prevents undesired heat transfer to another layer.

2. A controlled laser crystallization process of claim 1 wherein said amorphous layer is included in said second device layer.

3. A controlled laser crystallization process of claim 1 wherein said crystallization area corresponds to a patterned active area and is formed before application of said laser 4. A controlled laser crystallization process of claim 1 wherein said crystallization area corresponds to a device area.

5. A controlled laser crystallization process of claim 4 wherein said device is a transistor.

6. A controlled laser crystallization process of claim 4 wherein said area is up to 10 square micrometers.

7. A controlled laser crystallization process of claim 1 further comprising:
   applying a coat layer before application of said laser; and
   removing said coat layer after said application of said laser.

8. A controlled laser crystallization process of claim 1 wherein pattern laser crystallization is utilized.

9. A three dimensional multilayer integrated circuit fabrication method comprising:
   forming a first device layer; and
   forming a second device layer on top of said first device layer with minimal detrimental heat transfer to said first device layer by utilizing a controlled laser layer crystallization process for re-crystallization, wherein a crystallization area is defined to prevent undesired heat transfer between said first device layer and said second device layer and said crystallization area is included in a single crystal fabrication region of said second device layer formed from silicon seed of said first device layer.

10. Three dimensional multilayer integrated circuit fabrication method of claim 9 wherein said controlled laser layer crystallization process re-crystallizes a single crystal region in said second device layer.

11. A three dimensional multilayer integrated circuit fabrication method of claim 9 wherein said controlled laser layer crystallization process applies heat in a defined area of said second layer without detrimental effects on said first layer.

12. A three dimensional multilayer integrated circuit fabrication method of claim 9 wherein said area is the size of a device.

* * * * *